(12) United States Patent
Kitabatake

(10) Patent No.: US 6,266,930 B1
(45) Date of Patent: Jul. 31, 2001

(54) SAFEGUARD STRUCTURE AND TRANSACTION DEVICE

(75) Inventor: Hiroyuki Kitabatake, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/418,513

(22) Filed: Oct. 15, 1999

(30) Foreign Application Priority Data

May 12, 1999 (JP) .................................................. 11-131417

(51) Int. Cl.[7] .................................................. E04F 19/00
(52) U.S. Cl. ..................................... 52/27; 70/58; 109/51
(58) Field of Search ................................... 52/27; 248/501, 248/502, 680; 109/50, 51, 52; 70/58

(56) References Cited

U.S. PATENT DOCUMENTS

| | | | |
|---|---|---|---|
| 4,377,254 | * 3/1983 | Huffman et al. | 248/680 X |
| 4,615,280 | * 10/1986 | Shoop et al. | 109/50 X |
| 5,135,197 | * 8/1992 | Kelley et al. | 70/58 X |
| 5,488,914 | * 2/1996 | Ouellette | 109/50 X |
| 5,573,319 | * 11/1996 | Dirk | 52/27 X |
| 5,697,233 | * 12/1997 | Albert et al. | 70/58 |
| 5,699,992 | * 12/1997 | Hauser | 248/680 X |
| 5,774,330 | * 6/1998 | Melton et al. | 312/223.2 X |
| 5,778,805 | * 7/1998 | Green | 109/51 |
| 6,024,330 | * 2/2000 | Mroz et al. | 248/680 X |
| 6,047,940 | * 4/2000 | Kaplan | 248/501 |

OTHER PUBLICATIONS

Patent Abstracts of Japan of Japanese Patent Application No. 10–246999, Sep. 14, 1998.

* cited by examiner

Primary Examiner—Peter R. Brown
Assistant Examiner—Hanh V. Tran
(74) Attorney, Agent, or Firm—Staas & Halsey LLP

(57) ABSTRACT

A safeguard structure for making burglary of an entire object device difficult or impossible. The safeguard structure includes and installation board that comes into surface contact with an installation place and has the area wider that the bottom area of the object device and a fixture mechanism for fixing the installation board with the object device. Affixing the object device and the installation board makes the combination of the object and the installation board device large enough to prevent removal of the combination from the installation place.

11 Claims, 6 Drawing Sheets

SAFEGUARD STRUCTURE AND TRANSACTION DEVICE

BACKGROUND OF THE INVENTION

The present invention relates generally to structures, and more particularly to a safeguard structure that is connected to an object device and protects the object device against external/internal influence (e.g., centroidal unbalancing, seismic or other vibration, and burglary). The present invention is suitable, for example, as a safeguard structure for automatic transaction devices (vending machines, ATMs, etc.).

A variety of security and burglarproof mechanisms have conventionally been proposed, especially to those automatic transaction devices which carry cash, such as vending machines and ATMs, for preventing cash in the device from being reached immediately only by destroying its facade. In setting up those standing apparatuses vending machines, one has been secured them on a foundation via anchor bolts or by stretching tension rods from the ceiling and/or pillars to prevent overturning by centroidal unbalancing, seismic or other vibration.

However, due to the development of the burglarproof mechanisms, burglars tend to prefer stealing a vending machine entirely and then taking time in discomposing the machine, to taking apart the machine in the place and picking up cash out of the machine. In particular, the recent trend in miniature equipment has facilitated to carry the entire machine.

In the meantime, those (i.e., customers) who attempt to install a vending machine in a building and a store are not always an owner of the building etc., but usually merely a tenant of the building etc. In addition, even when the customers wish to secure the vending machine onto the floor by anchor bolts, the owners of the building etc. often do not allow the building alteration, including by anchor bolts and tension rods, for the reason that such and alteration would damage the strength of the floor or result in bad appearance. This accounts for an insufficient fixation of a vending machine, increasing risks of overturning and theft. Moreover, a vending machine when installed onto the floor would often exceed the permissible weight per unit area on the floor, and thus the customers hesitate to install a vending machine on a high floor.

SUMMARY OF THE INVENTION

Accordingly, it is a general and exemplified object of the present invention to provide a novel and useful safeguard structure in which the above disadvantages are eliminated.

A more specific and exemplified object of the present invention is to provide a safeguard structure that prevents burglary of the entire object device.

Another exemplified object of the present invention is to provide a safeguard structure that enables fixing an object device onto the floor without damaging the installment site.

Moreover, it is another exemplified object of the present invention to provide a safeguard structure that allows installing a vending machine onto a floor by dispersing its weight so that it may not exceed the permissible weight of the floor.

In order to achieve the above objects, a safeguard structure of one aspect of the present invention comprises and installation board which comes into surface contact with an installation place onto which an object device is to be installed, and has an area wider than that of a bottom area of the object device, and a fixture mechanism for fixing the installation board with the object device, wherein the installation board exists in a closed space having a frontage having a predetermined size, and the installation board may not exit the frontage. According to the above safeguard structure, the installation board comes in surface contact with the installation place onto which the object device is to be installed, thereby dispersing the weight of the object device and transmitting it to the installation place (such as, a floor). The installation board has the area wider than the bottom area of the object device, and prevents overturning of the object device. An addition of the installation board to the object device makes the object device large, and the structure including the object device and the installation board is larger than the frontage of the closed space, rendering it impossible to burglar the entire device.

A safeguard structure of another aspect of the present invention comprises a bottom plate fixed onto a bottom of an object device having an openable housing shape, and a fixture mechanism for fixing the bottom plate onto an installation place inside the object device by opening the housing of the object device. According to the above safeguard structure, the object device is fixed onto the installation place from inside the object, requiring one who attempts to carry the entire object device without opening the housing, to open the housing in order to access the fixture mechanism.

A safe guard structure of another aspect of the present invention comprises a fixture structure for fixing an object device onto an installation place, and a skirt, incorporated with the object device and located between the object device and the installation place, which shields the fixture mechanism. According to the above safeguard structure, the skirt has an exemplified function of hiding the structure of the fixture mechanism from the outside. The skirt also has another exemplified function of prohibiting access to the fixture mechanism that releases the fixation by the fixture mechanism for fixing the object device onto the installation place from the outside. The skirt incorporated with the object device has an improved security function in comparison with the conventional skirt that is detachably provide. The skirt is provided typically at, but not limited to, the bottom of the object device.

A safeguard structure of another aspect of the present invention comprises an installation board located on an installation place onto which an object device is to be installed, said installation board having an area wider than a bottom area of the object device, and fixture mechanism which fixes said installation board with the object device. According to the above safeguard structure, the installation board has an area wider than the bottom area of the object device, preventing overturning of the object device. Moreover, an addition of the installation board is added to the object device makes the object device large, rendering it impossible to steal the entire device.

A transaction device of one aspect of the present invention which performs monetary transactions in response to user's manipulation comprises a housing, an installation board which comes into surface contact with an installation place onto which the housing is to be installed, and has an area wider than a bottom area of the housing, and a fixture mechanism for fixing the installation board with the housing, wherein the installation place exists in a closed space having a frontage having a predetermined size, and the installation board is dimensioned so that a structure including the object device and the installation board may not exit the frontage. Such a transaction device has effects similar to those of the safeguard structure.

Other objects and further features of the present invention will become readily apparent from the following description and accompanying drawings.

DETAILED DESCRIPTION OF PREFERRED EMBODIMENTS

Figure 1:
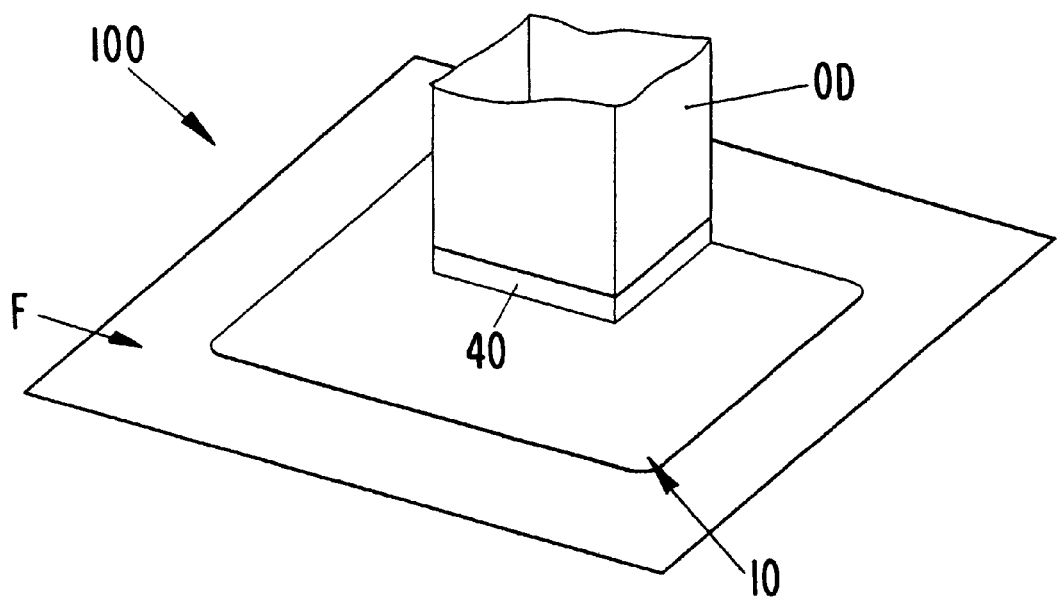
FIG. 1 is a schematic perspective view for explaining a safeguard structure of one embodiment according to the present invention.
Figure 2:
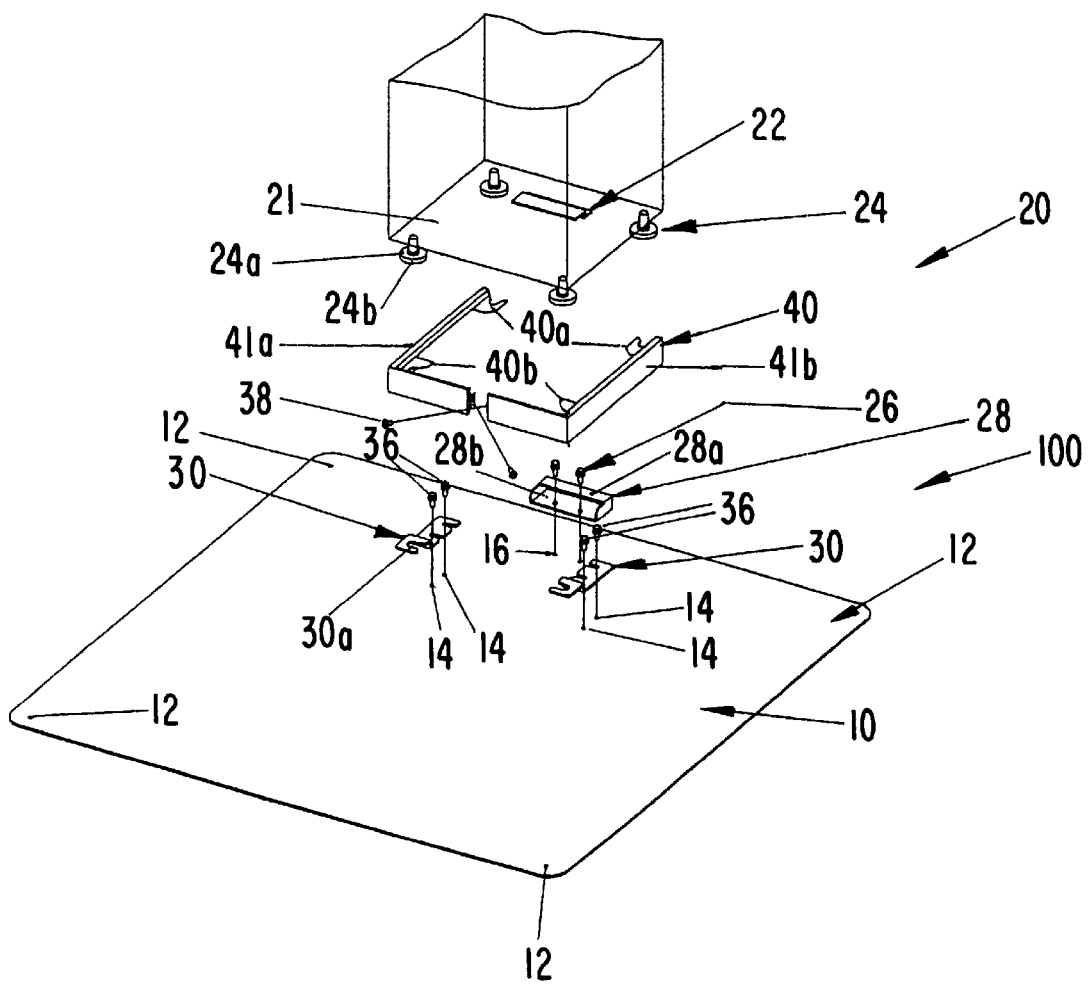
FIG. 2 is an exploded perspective view of the safeguard structure shown in FIG. 1.

With reference to the accompanying drawings, a description will now be given of safeguard structure 100 as one aspect of the present invention. As shown in FIGS. 1 and 2, the safeguard structure 100 has installation board 10 and fixture mechanism 20. FIG. 1 is a schematic perspective view for explaining the safeguard structure 100 of one embodiment according to the present invention. FIG. 2 is an exploded perspective view of the safeguard structure 100 shown in FIG. 1.

The installation board 10 is mounted on installation place F, such as a floor, onto which object device OD is to be installed. Optionally, it may be fixed onto the installation place F by holes 12 shown in FIG. 2 and anchor bolts (not shown) as in the prior art. The installation board 10 of this embodiment has several functions including preventing tipping over of the object device OD. The conventional structure had no installation board 10, and thus the object device OD needed to be fixed by anchor bolts and tension rods directly onto installation place F, e.g., a floor. However, the object device OD usually unstably stood on building etc., from altering the installation place. On the contrary, the installation board 10 of this embodiment stably supports the object device OD without damaging the installation place F. The installation board 10 has an area wide enough to prevent overturning of the object device OD, at least more than the bottom area of the object device OD, but more preferably as calculated by considering the centroid and weight of the object device OD. Thus, intentional overturning is prevented and earthquake-resistant strength of the object device OD is improved.

The installation board 10 also serves to prevent the local concentration of the weight of object device OD onto the installation place F. For example, where the object device OD is mounted directly onto the installation place F which is the floor (having P tile and free access board) via level foots 24 which will be discussed later, each level foot 24 respectively supports about one-fourth of the weight of the object device OD. Therefore, the weight of object device OD is locally concentrated on the floor under each level foot 24, and the overweight often damaged the floor (such as, damages to P tiles and deformation and/or warp of the free access board). On the other hand, the installation board 10 of this embodiment disperses the weight of the object device OD throughout its area, and prevents damages to the installation place F by effectively utilizing the are of around the object device OD. Thereby, for example, one who attempts to install the vending machine on the second floor is relieved from worrying about the floor dropping out.

The installation board 10 has a rectangle plate shape in this embodiment, but such a shape is a mere example. for example, the installation board 10 may be equipped with a difference in level or projection that similarly serves as stopper fixture metal fittings 28 or level foots 24 which will be described later, eliminating these members. The installation board 10 comes into surface contact with the installation place F, and has an area larger than the bottom area of the object device OD. This invention is applicable for both an indoor and an outdoor installation place F. The installation board 10 is made as a steel plate of 5 mm thickness and has some essential or optional holes 12–18, which will be explained with the following fixture mechanism 20.

For example, suppose the installation place F is an indoor closed space, such as in a building or store, (e.g., room, store, elevator, etc.), and the closed space has an opening/closing member, such as a door or shutter, and a frontage (opening) having a predetermined size. Preferably, the installation board 10 is dimensioned so that a structure composed of the object device OD and the installation board 10 is longer, wider and/or higher than the frontage. Thus, the object device OD with the installation board 10 cannot be carried out of the closed space, improving the burglar-resistance.

As an example, the Japanese Industrial Standard ("JIS") roughly defines elevator sizes; its Standard p-11-CO defines the frontage (width) 1400 mm×depth 1350 mm ×height 2300 mm, with an effective entrance width 800 mm ×height 2100 mm. If the safeguard structure 100 of this embodiment is installed in the building using this type of elevator, the installation board 10 designed to have a size of approximately width 2000 mm ×depth 1200 mm may be carried out when raised, but may not be taken out when incorporated with the object apparatus OD since its size exceeds the width of the elevator.

Of course, it should be noted that length, width and/or height of the structure may not be set larger than the frontage depending upon the shape of the closed space, for example, where the closed space has a complicated structure. As a consequence, its is sufficient that the installation board 10 is set to have a size such that the aforementioned combination structure may not exit the frontage, like a bottle ship. Of course, in this case, the installation 10, the fixture mechanism 20, and the object device OD are independently carried in the closed space, and then put together there.

The fixture mechanism 20 fixes the installation board 10 with the object device OD. This requires one who attempts to carry out the entire object device OD, to carry the installation board 10 at the same time, thereby improving burglar-resistance. The fixture mechanism 20 includes bottom plate 21, stopper 22, level foots 24, bolts 26 and 36, stopper fixture metal fitting 28, level foot fixture metal fittings 30, pulling-our prevention bolt 32 (FIG. 3), and anchor bolts 34 (FIG. 4).

The bottom plate 21 is fixed onto the bottom of the object device OD, but may be part of the object device OD or may be formed as a separate member. The bottom plate 21 of this embodiment has a rectangular shape, but may have another shape depending upon the shape of the object device OD. As shown in FIG. 4, the bottom plate 21 is fixed onto the installation board 10 by four anchor bolts 34 inserted into the holes 18. As shown FIG. 3, these four anchor bolts 34 are engaged with the installation board 10 inside the object device OD via the bottom plate 21 after the stopper 22 and the stopper fixture metal fittings 28 are fixed onto the installation board 10. The object device OD has an openable housing shape, and the anchor bolts 34 fix the bottom plate 21 onto the installation board 10 inside the object device OD by opening the housing of the object device OD. In this way, the anchor bolts 34 secure the object device OD inside the device OD. Thus, one who tries to steal the entire device needs after all to open the housing in order to access the anchor bolts 34. It is understood that the fixture means inside the object device OD thus improves the burglar-resistance, and is applicable to the conventional installation method for installing the object device OD onto the installation place F via the installation board 10.

As shown in FIG. 2, four level foots 24 at four corners of the bottom plate 21 serve as a pedestal. These level foots 24 have an exemplified convex shape in section that is made by incorporating two differently sized cylinders 24a and 24b with each other. Optionally, the level foots 24 serve to adjust a height so as to adjust the centroidal position of the object device OD and achieve installation to a slight difference in level. The level foot fixture metal fittings 30 are provided so as to engage two level foots 24, and metal fitting 30 are fixed onto the holes 14 in the installation board 10 by four bolts 36, as shown FIG. 2. The level foot fixture metal fitting 30 include engagement portions 30a engageable with the upper cylinder portion of the level foot 24, as shown in FIG. 2.

Figure 4:
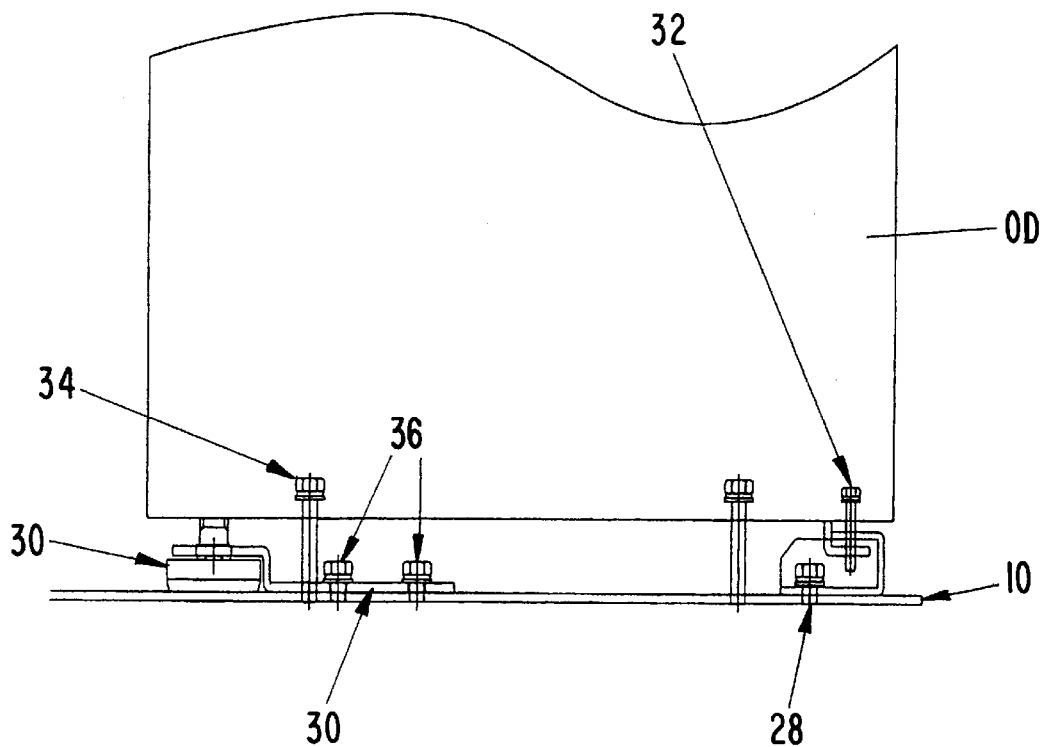
FIG. 4 sectional view of the safeguard structure shown in FIG. 1.

The stopper 22 has, as shown in FIG. 4, an L-shaped section having a predetermined width, a perpendicular portion of which extends approximately perpendicular to the bottom plate 21, and a horizontal portion of which extends approximately horizontal to the bottom plate 21. The stopper fixture metal fitting 28 has, as shown in FIG. 2, an approximately J-shaped section with upper plate 28a narrower than lower plate 28b. The stopper 22 is located in the space formed by the upper and lower plates 28a and 28b. As shown in FIG. 2, two bolts 26 penetrate the lower plate 28b, and engage the holes 16 in the installation board 10. A pull-out prevention bolt 32 penetrates the stopper 22 and the upper plate 28a, as shown in FIG. 4. Thereby, the stopper 22 is fixed onto the stopper fixture metal fittings 28, while the stopper fixture metal fittings 28 are fixed onto the installation board 10.

The stopper 22 and stopper fixture metal fittings 28 enable the object device OD to be fixed onto the installation board 10 by a surface contact using the lower plate 28b of the stopper 28. That is, each pulling-our prevention bolt 32 connects the object device OD with the installation board 10 by its narrow area, and thus is vulnerable to vibration applied by a thief or by earthquakes to the object device OD. Therefore, the stopper 22 and stopper fixture metal fittings 28 enable the object device OD to be fixed onto the installation board 10 by an area larger than the pulling-out prevention bolts 32, safely preventing overturning and separation.

These pulling-out prevention bolts 32 fix the stopper fixture metal fittings 28 and the stopper 22 inside the object device OD, and the housing of the device OD should be opened to remove the pulling-out prevention bolt 32. Therefore, the pulling-out bolts 32 improve the burglar-resistance, as the anchor bolts 34.

The skirt 40 is provided to hide from the outside the structure of the fixture mechanism 20 including the stopper 22 and the level foots 24. In particular, the fixture members, such as the level foot fixture metal fittings 30 are fixed to the object device OD outside the object device OD, and these fixture members are easily accessible when the 40 is removed. Accordingly, the skirt 40 serves to prohibit access to the members externally fixed onto the installation board 10. The skirt 40 also prevents coin and goods from going into under the object device OD when it is constructed as a vending machine. The skirt 40 includes engagement portions 40a engageable with the upper cylinders 24a of two level foots 24 which do not engage the level foot fixture metal fittings 28, and engagement portions 40b engageable with the upper cylinders 24a of two level foots 24 which engage the level foot fixture metal fittings 28. The skirt 40 is made by incorporating two elements 41a and 41b with each other by screw 38. If necessary, in addition to the screw 38, key and lock, e.g., a combination key, may be provided to ensure prevention of the skirt 40 from being taken apart.

Figure 3:
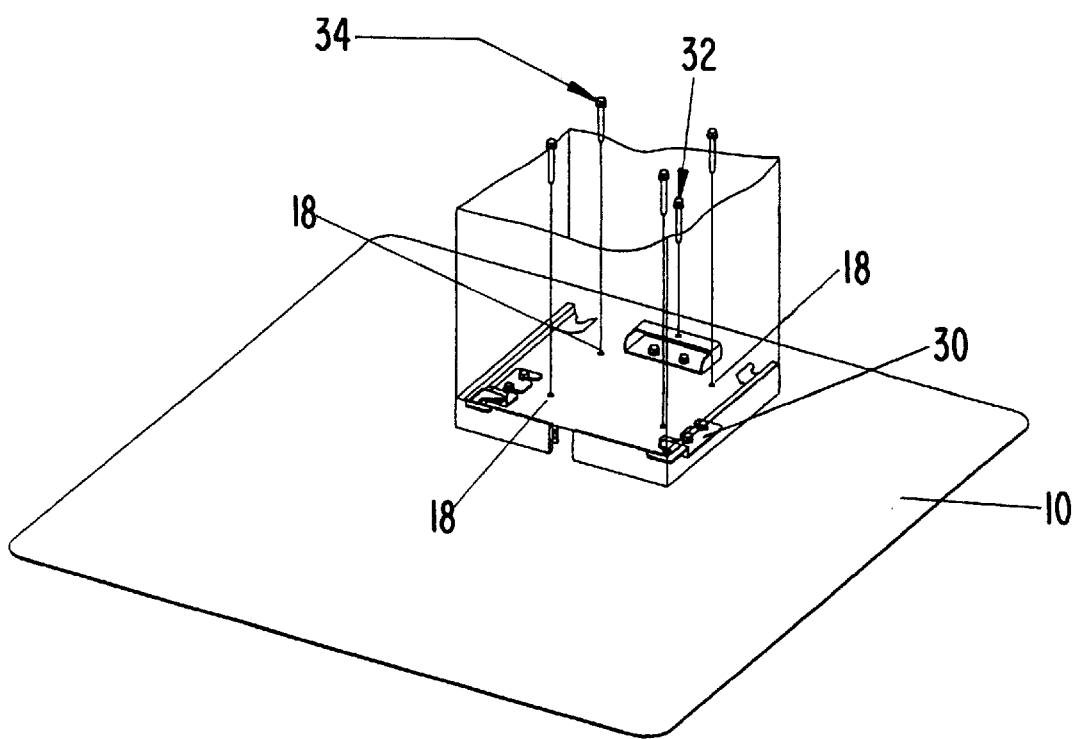
FIG. 3 is an exploded perspective view of the safeguard structure shown in FIG. 1.

In an alternative embodiment, the skirt 40 is incorporated with part (for example, a bottom) of the object device OD. Since the skirt 40 shown in FIG. 3 is formed as a separate member from the object device OD, an insolent fellow might kicks it open, uncovering the structure of the fixture mechanism 20. However, if it is incorporated with the object device OD, it is never removed from the object device OD and the structure of the fixture mechanism 20 is never disclosed. In that case, the skirt may be made unopenable or openable.

As mentioned above, the safeguard structure 100 preferably includes an anchor bolt that is inserted into the hole 12 in the installation board 10 and fixes the installation board 10 onto the installation place F. This sets up the object device OD more stably upon the installation place F. However, this anchor bolt is an option, and the installation board 10 may successfully prevent overturning of the object device OD without such an anchor bolt.

Figure 5:
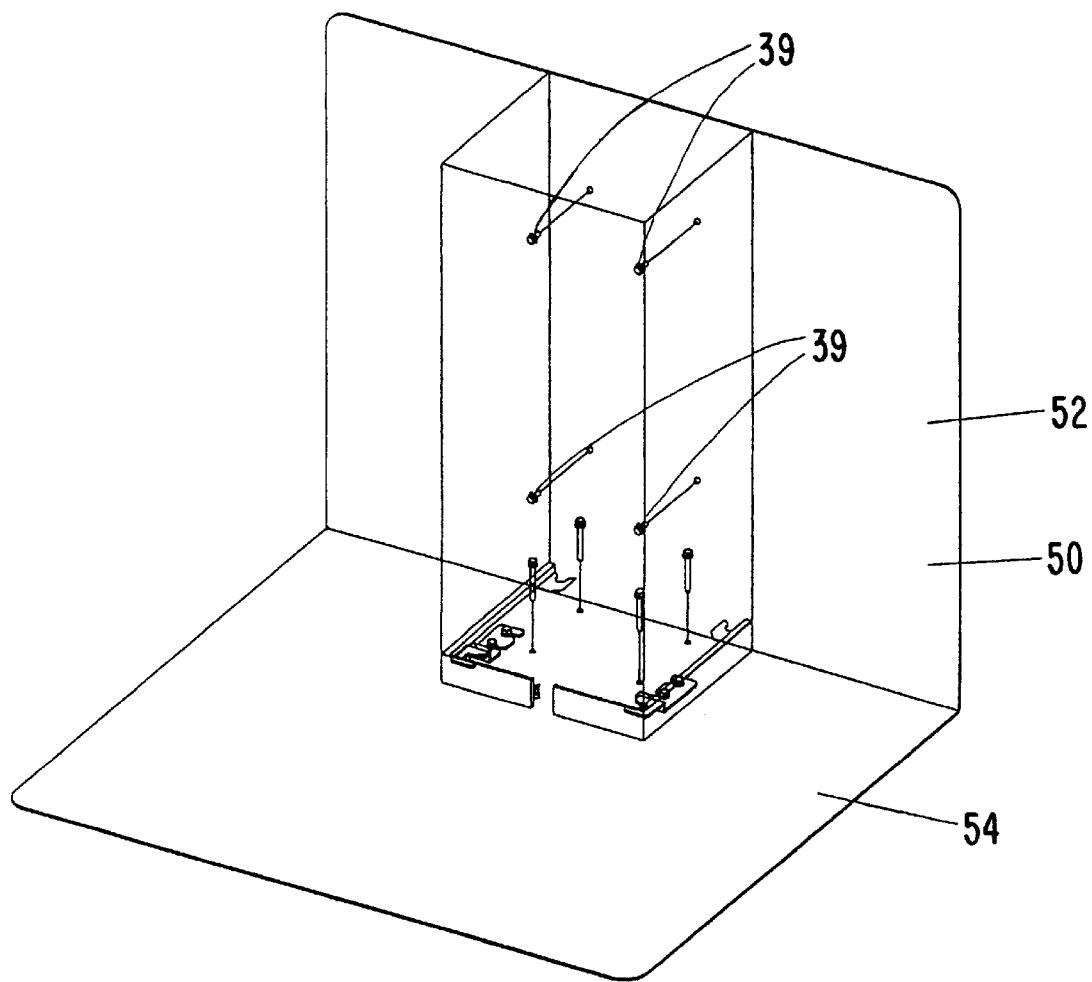
FIG. 5 is a perspective view showing a modification of the installation board in the safeguard structure shown FIG. 1.

As shown in FIG. 5, installation board 50 of another embodiment according to the present invention has an approximately L-shaped section, and preferably made of a single member. The single member of installation board 50 could not be divided into perpendicular part 52 and horizontal part 54 and separately carried out the installation board 50, increasing difficulty in carrying out with the object device OD. in this case, the fixture mechanism 20 further includes four anchor bolts 39 which secure bottom and back surfaces of the object device OD onto the installation board 10. Clearly, the installation board 50 may further includes another surface that is perpendicular both perpendicular and horizontal parts 52 and 54.

Figure 6:
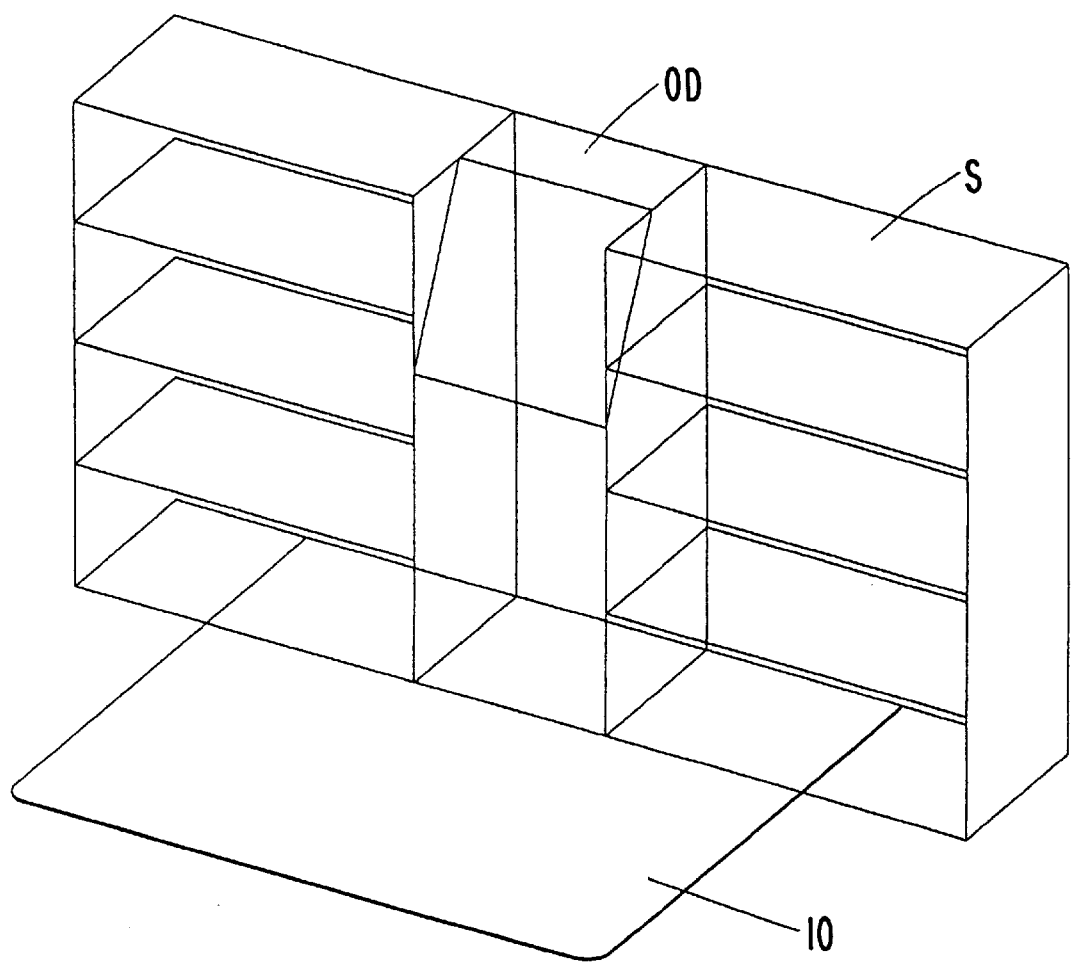
FIG. 6 is a perspective view for explaining another application example of the installation board in the safeguard structure shown in FIG. 1.

Although the above embodiments fix only one object device OD onto the installation board 10 and 50, it is clear the present invention may secure a plurality of object devices OD onto the installation board 10 and 50. This requires one who attempts to one object device OD entirely, to carry out all the object devices ODs and the installation boards 10 and 50, increasing the difficulty in conveyance. The conveyance also becomes more difficult in connection with the frontage having a predetermined size. The installation board 10 may support shelf S, as shown in FIG. 6. The shelf may be fixed onto the installation board 10 and/or the object device OD, but even if not, the weight of the shelf S is added to the installation board 10, increasing difficulty in conveyance of the device OD and the installation board 10.

Further, the present invention is not limited to the embodiments illustrated and described, but various variations and modifications may be made without departing from the scope of the invention.

According to the safeguard structure and the transaction device as one aspect of the present invention, the installation board comes to surface contact with the installation place, dispersing the weight of the object device and transmitting it to the installation place (such as, a floor). Therefore, damage ( such as, a deformation and floor dropping) of the installation place may be prevented. The installation board prevents overturning of the object device since the installation board has an area wider than the bottom area of the object device, thus preventing damages and overturning accidents of the object device. An addition of the installation board to the object device makes a structure of the installation board and the object device larger than the frontage of the closed space, and makes it impossible to steal the entire device, improving the burglar-resistance of the object apparatus. The object device which is fixed onto the installation place on its inside requires one who attempts to steal the entire device without opening the housing, to eventually open the housing so as to access the fixture mechanism. Therefore, the burglar-resistance of the object device is improved.

According to the safeguard structure as one aspect of the present invention, the skirt is incorporated with the object device and unremovable from it. Therefore, the skirt serves to effectively hide the structure of the fixture mechanism from the outside, and effectively prevents an access to the fixture mechanism by one who attempts to release the fixation by the fixture mechanism which fixes the object device onto the installation place from the outside.

What is claimed is:

1. A safeguard structure comprising:
    an installation board which comes into surface contact with an installation place onto which an object device is to be installed, and has an area wider than that of a bottom area of the object device; and
    a fixture mechanism for fixing said installation board with the object device, wherein the installation place exists in a closed space having a frontage that is large enough to move out the object device and said installation board separately from the closed space, and said installation board is dimensioned so that a structure including the object device and said installation board in combination may not exit the frontage.

2. A safeguard structure comprising:
    an installation board which comes into surface contact with an installation place onto which an object device is to be installed, and has an area wider than that of a bottom area of the object device; and
    a fixture mechanism for fixing said installation board with the object device, wherein the installation place exists in a closed space having a frontage having a predetermined size, and said installation board is dimensioned so that a structure including the object device and said installation board may not exit the frontage, wherein the object device has an openable housing shape, said safeguard structure further comprises a bottom plate fixed on a bottom of the object device, and said fixture mechanism fixes the bottom plate onto said installation board inside the object device by opening the housing of the object device.

3. A safeguard structure comprising:
    a installation board which comes into surface contact with an installation place onto which an object device is to be installed, and has an area wider than that of a bottom area of the object device; and
    a fixture mechanism for fixing said installation board with the object device, wherein the installation place exists in a closed space having a frontage having a predetermined size, and said installation board is dimensioned so that a structure including the object device and said installation board may not exit the frontage, wherein said installation board comprises a single member having an approximately L-shaped section, and said fixture mechanism fixes two surfaces of the object device onto the installation board.

4. The safeguard structure according to claim 1, wherein said fixture mechanism fixes a plurality of object devices onto said installation board.

5. A transaction device which performs monetary transactions in response to use manipulation, said transaction device comprising:
    a housing to store components for the monetary transactions:
    an installation board which comes into surface contact with an installation place onto which said housing is to be installed, and has an area wider than a bottom area of said housing; and
    a fixture mechanism for fixing said installation board with said housing, wherein the installation place exists in a closed space having a frontage that is large enough to move out the object device and said installation board separately from the closed space, and said installation board is dimensioned so that a structure including the housing and said installation board in combination may not exit the frontage.

6. A safeguarded transaction apparatus, comprising:
    an openable housing having a mounting surface external to the housing, an inner surface opposite the external surface and a passage between the inner surface and the outer surface, the passage accessible where the housing is open and not accessible where the housing is closed;
    an installation board;
    a plurality of slotted receptacles affixed to the installation board;
    a plate affixed to the mounting surface of the housing;
    a plurality of mounting feet engaged with and extending from the plate, each mounting foot having a first size which engages a respective one of the slotted receptacles and a second size which serves to contact the installation board, the second size larger than the first size; and
    a fastener which passes through the passage to secure the housing to the installation board.

7. The apparatus as claimed in claim 6, further comprising;
    L-shaped protrusion extending from the mounting plate; and
    a J-shaped receptacle attached to the installation board which receives the L-shaped protrusion.

8. The apparatus as claimed in claim 7, wherein the L-shaped protrusion has a passage and the fastener passes through the passage and is received by the J-shaped receptacle.

9. The apparatus as claimed in claim 6, further comprising a segmented skirt which closes a space between the housing and the installation board.

10. The apparatus as claimed in claim 9, wherein the segmented skirt further comprises a slot which engages one of said plurality of mounting feet along the first size.

11. The apparatus as claimed in claim 10, wherein the segments of the skirt are locked together to prevent removal of the skirt.

* * * * *